United States Patent
Schilling et al.

(10) Patent No.: US 7,656,672 B2
(45) Date of Patent: Feb. 2, 2010

(54) POWER MODULE

(75) Inventors: Oliver Schilling, Warstein (DE); Reinhold Spanke, Bestwig (DE)

(73) Assignee: Infineon Technologies AG, Neubiberg (DE)

( * ) Notice: Subject to any disclaimer, the term of this patent is extended or adjusted under 35 U.S.C. 154(b) by 207 days.

(21) Appl. No.: 11/381,881

(22) Filed: May 5, 2006

(65) Prior Publication Data

US 2007/0119820 A1    May 31, 2007

Related U.S. Application Data

(63) Continuation of application No. PCT/EP2004/012810, filed on Nov. 11, 2004.

(30) Foreign Application Priority Data

Nov. 11, 2003  (DE)  ................. 103 52 671

(51) Int. Cl.
*H05K 1/14*   (2006.01)
(52) U.S. Cl. ...................... 361/736; 361/752
(58) Field of Classification Search ............. H05K 1/14
See application file for complete search history.

(56) References Cited

U.S. PATENT DOCUMENTS

| | | | | |
|---|---|---|---|---|
| 5,410,450 A * | 4/1995 | Iida et al. | .................... | 361/736 |
| 5,705,853 A | 1/1998 | Faller et al. | .................. | 257/719 |
| 5,767,576 A | 6/1998 | Kobayashi et al. | .......... | 257/701 |
| 6,078,501 A | 6/2000 | Catrambone et al. | ........ | 361/704 |
| 6,359,331 B1 * | 3/2002 | Rinehart et al. | ............. | 257/691 |
| 6,853,088 B2 | 2/2005 | Ferber et al. | ................. | 257/782 |
| 2003/0128526 A1 * | 7/2003 | Sakai et al. | .................. | 361/736 |
| 2003/0137980 A1 * | 7/2003 | Inoue et al. | ................. | 361/736 |
| 2005/0219827 A1 * | 10/2005 | Tateyama et al. | ........... | 361/736 |
| 2006/0001146 A1 | 1/2006 | Passe et al. | ................. | 257/690 |

FOREIGN PATENT DOCUMENTS

DE    19721061 A1    11/1997

(Continued)

OTHER PUBLICATIONS

Liu, C., et al.; "Power Hybrid Module"; IBM Technical Disclosure Bulletin; Vo. 16, No. 5; pp. 1610-1611, Oct. 1973.

(Continued)

*Primary Examiner*—Douglas W Owens
*Assistant Examiner*—Yuriy Semenenko
(74) *Attorney, Agent, or Firm*—Coats & Bennett, P.L.L.C.

(57) ABSTRACT

A power module has several circuit units (20, 21) that are electrically connected in parallel and are provided with terminal contacts (5, 5') which are electrically and mechanically interconnected via at least one current-conducting saddle (26). In order to create a power module which is easy to produce and in which the current-conducting saddle (26) requires little space, the saddle (26) is embodied in several parts while encompassing a terminal element (12) that can be connected in a fixed manner to a terminal contact (5) of a circuit unit (20) independently of a connecting element (25) of the saddle (26). The connecting element (25) of the saddle (26) extends on a plane that is spaced apart from the circuit unit (20) while being electrically connected to the terminal element (12).

7 Claims, 8 Drawing Sheets

FOREIGN PATENT DOCUMENTS

| | | |
|---|---|---|
| DE | 10103084 A1 | 8/2002 |
| DE | 102004027185 A1 | 12/2005 |
| DE | 102004042367 A1 | 3/2006 |
| EP | 0546731 A1 | 11/1992 |
| EP | 0546731 | 6/1993 |
| EP | 0584668 A1 | 8/1993 |
| EP | 0584668 A1 | 3/1994 |
| EP | 0762496 A2 | 7/1996 |
| EP | 0762496 | 3/1997 |
| EP | 0924845 A2 | 12/1998 |
| EP | 0924845 | 6/1999 |
| JP | 54-161335 A | 12/1979 |
| JP | 59-195857 A | 11/1984 |
| JP | 07086498 A | 3/1995 |
| JP | 10-200048 A | 7/1998 |
| JP | 11-145377 A | 5/1999 |
| JP | 11214600 | 8/1999 |
| JP | 11317496 | 11/1999 |
| JP | 2000-082772 A | 3/2000 |
| WO | WO 2006/024330 A1 | 3/2006 |
| WO | WO2006/024330 A1 | 3/2006 |

OTHER PUBLICATIONS

Liu, C., et al.; "Power Hybrid Module"; IBM Technical Disclosure Bulletin; vol. 16, No. 11; pp. 3826-327, Apr. 1974.

International Preliminary Report Application No. PCT/EP2004/012810 filed Nov. 11, 2004, 7 pages, May 15, 2006.

\* cited by examiner a)

b)

c)

a')

b')

c')

POWER MODULE

CROSS-REFERENCE TO RELATED APPLICATION

This application is a continuation of co-pending International Application No. PCT/EP2004/012810 filed Nov. 11, 2004, which designates the United States, and claims priority to German application number DE 103 52 671.4 filed Nov. 11, 2003.

TECHNICAL FIELD

The invention lies in the field of power electronics, particularly power semiconductor electronics, and relates to a power module having a plurality of circuit units with terminal contacts which are electrically connected to one another via at least one current-carrying strap.

BACKGROUND

Power modules of this type frequently have a plurality of parallel-connected circuit units in order to realize a high current-carrying capacity. The circuit units may be implemented, for example, on substrates on which power components are arranged, it being possible to make electrical contact with said power components via conductor tracks and terminal contact points (so-called contact pads). In order to connect the circuit units in parallel, the latter are connected to one another via current-carrying straps.

DE 197 21 061 A1 reveals a power module having a housing for holding a plurality of electronic components and having a plurality of terminal contacts for internal and/or external electrical connection. The module comprises a plurality of ceramic substrates on which semiconductor components are respectively arranged and connected so as to form circuit units. Contact can be externally made with the circuit units via a connection block which also connects the circuit units to one another. The connection block is comparatively expensive and has a high construction. Detailed information as regards the connection of the circuit units cannot be gathered from DE 197 21 061 A1.

SUMMARY

It is an object of the present invention to specify a power module and a method for producing the latter, in which the current-carrying strap requires only a small amount of space and can be easily connected to the circuit unit using common connecting techniques and without impairing the remaining components of the module.

According to the invention, this object can be achieved by a power module comprising a plurality of circuit units, which are connected in parallel, and a current-carrying strap, each circuit unit having a terminal contact with which contact is to be made and which is electrically connected in a parallel manner to the corresponding terminal contact of another circuit unit via the current-carrying strap, wherein the strap has a plurality of separate connection elements and a connecting element, each connection element is assigned to the terminal contact of only a single one of the circuit units, each connection element can be permanently connected to the terminal contact assigned to it independently of the connecting element and the further connection elements of the power module, and the connecting element connects the circuit units in parallel by means of a connection to the separate connection elements.

At least one of the connection elements can be L-shaped. At least one of the connection elements may have a foot region which is connected to the terminal contact of the circuit unit. At least one of the connection elements can be connected to a terminal contact of a circuit unit by means of bonding, soldering or laser welding. The connecting element may have a continuous section which electrically connects the separate connection elements to one another. A power module may further comprise a housing, the continuous section of the connecting element being arranged inside the housing. The continuous section can be arranged on that side of the connecting element which faces the common carrier.

The object can also be achieved by a method for connecting at least two circuit units of a power module, in which each circuit unit has a terminal contact which is to be connected to a terminal contact of another circuit unit, each terminal contact first of all being permanently electrically connected to a separate connection element, which is assigned to only the respective circuit unit, independently of the further parts of the power module, the circuit units being arranged on a common carrier, and the separate connection elements then being connected to a connecting element, with the terminal contacts of the circuit units being connected in parallel.

A plurality of circuit units first of all can be respectively connected to at least one connection element of current-carrying straps, and the respective connection elements then can be connected, using connecting elements, so as to form current-carrying straps. A plurality of current-carrying straps can be provided for the purpose of connecting a circuit unit. At least one of the connecting elements of the current-carrying straps essentially can be arranged parallel to the circuit unit. A continuous section of the connecting element, which section is provided for the purpose of electrically connecting the separate connection elements, can be arranged on that side of the connecting element which faces the common carrier. A continuous section of the connecting element, which section is provided for the purpose of electrically connecting the separate connection elements, can be arranged in a housing of the power module.

The present invention is based on the basic concept of configuring the current-carrying strap in a plurality of parts, a first part being permanently electrically connected, separately and independently from the remaining parts, to the circuit unit or to conductor tracks or pads (generally referred to as terminal contacts) which are provided on said circuit unit.

The first part has a foot region, which is connected to the terminal contact, and a neck region, which preferably extends essentially perpendicular to the circuit unit and, at its end, enables simple mounting or electrical connection to a second part of the current-carrying strap. In this connection, a preferred development of the invention provides for the first part to be L-shaped and for its foot region to be connected to the terminal contact of the circuit unit.

The second part is preferably in the form of a low-inductance conductor track or a strip conductor and runs essentially parallel to the plane of the circuit units. The second part preferably connects two or more circuit units in parallel by virtue of the fact that respective first parts of a plurality of circuit units are connected to it. The second part may also lead to an external connection.

This results in the fundamental advantage of the invention that the first part of the current-carrying strap can be connected in advance to the terminal contact provided, independently of the remaining components of the power module. This fabrication step can be carried out as a premounting step, to be precise at a point in time at which the terminal contact or the corresponding (foot) region of the first part is still readily accessible on all sides. This makes it possible to use inexpensive, proven and reliable connecting technologies, for example bonding, soldering or laser welding.

Another advantage of the invention resides in the fact that the electrical connection between the first part and the terminal contact can be tested before further mounting.

Arranging the second part of the current-carrying strap essentially parallel to the plane of the circuit units results in a very space-saving, compact configuration of the power module.

One refinement of the method according to the invention, which is preferred in terms of production engineering, provides for a plurality of circuit units to first of all be respectively connected to the first part of their current-carrying strap, for the circuit units to be arranged on a common carrier and for the respective first parts to then be connected to a common second part so as to form current-carrying straps.

The circuit units may be connected, for example, by being soldered to a common base plate. In this case, they are advantageously positioned using a mounting template which, during mounting, is arranged in the plane of the second part of the strap and has, for example, openings for the passage of the free ends of the first parts.

BRIEF DESCRIPTION OF THE DRAWINGS

The invention will be explained in more detail below with reference to the exemplary embodiments which are shown in the figures, in which.

DETAILED DESCRIPTION

Figure 1:
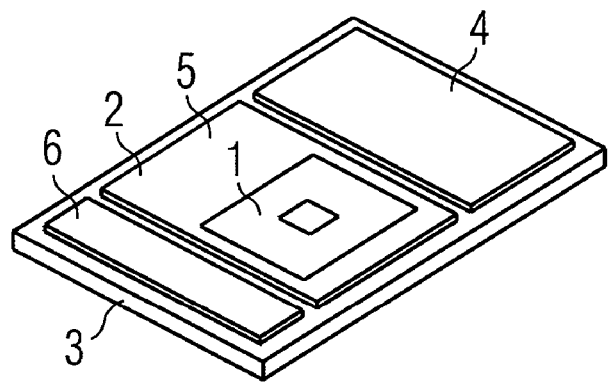
FIG. 1 shows the premounting of a circuit unit in a first mounting sequence.
Figure 1:
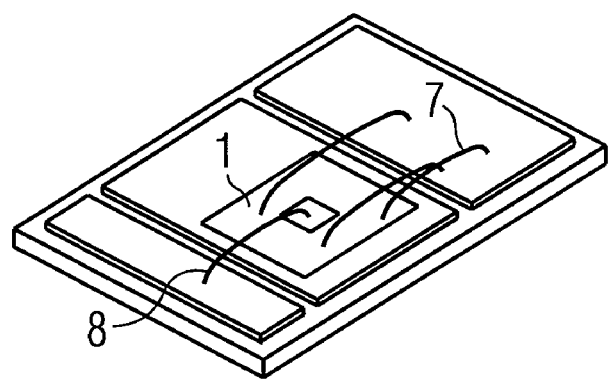
Figure 1:
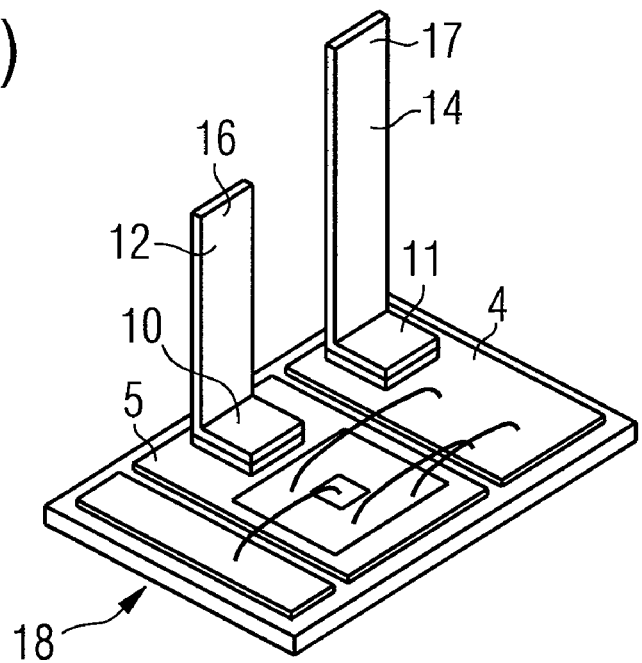

The premounting (shown in three mounting steps a), b), c) in FIG. 1) of a circuit unit begins with the application of a power component 1, for example a power semiconductor, to a conductor track 2 of a substrate 3 preferably by means of soldering (mounting step a)). Further conductor tracks or terminal contacts 4, 5, 6 are provided on the substrate. In a subsequent mounting step b), contact is made with the power semiconductor 1 using bonding wires 7, 8.

The terminal contacts 4, 5 are then electrically connected (mounting step c)) to the foot 10, 11 of a respective first part 12, 14 by means of soldering, laser welding or ultrasonic welding. The parts 12, 14 are L-shaped and their free end region of the L (neck region) 16, 17 projects upward essentially perpendicular to the plane 18 of the circuit unit. The first parts 12, 14 are connected before further mounting and independently of further parts 25, 27 (FIG. 3) which will form a respective current-carrying strap together with the parts 12, 14. The connection between the parts 12, 14 and the terminal contacts 4, 5 can be pretested at this stage, thus making it possible to considerably increase the fabrication quality and reliability.

Figure 2:
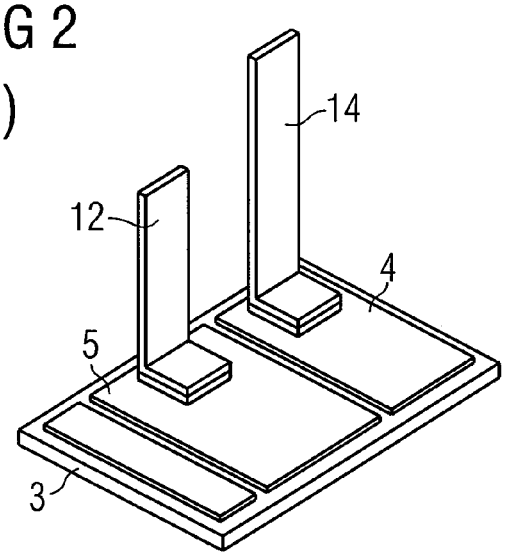
FIG. 2 shows the premounting of a circuit unit in a varied mounting sequence.
Figure 2:
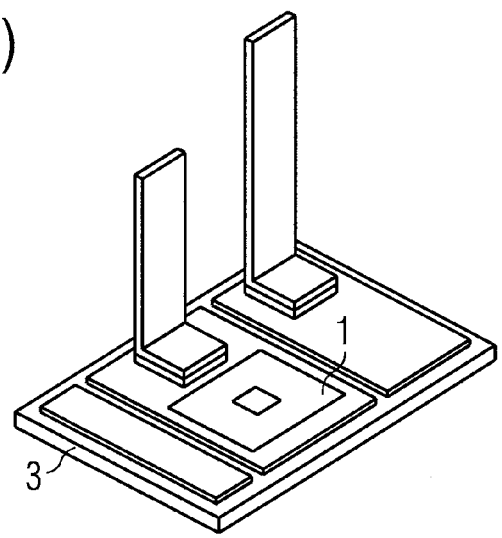
Figure 2:
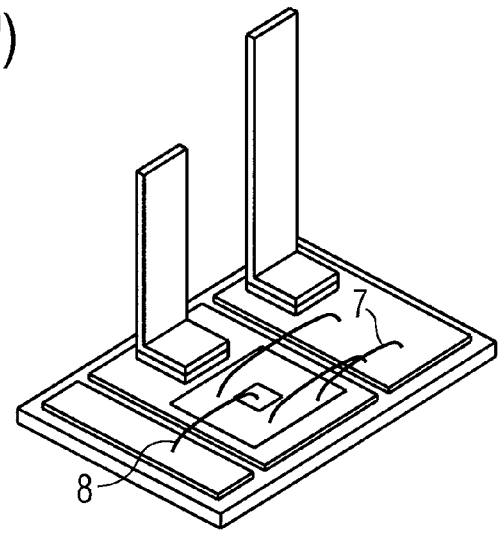

FIG. 2 shows another exemplary embodiment of the premounting operation when producing a power module according to the invention in three mounting steps a'), b'), c'), the same reference symbols as in FIG. 1 being used to denote the same elements. In this case, the parts 12, 14 are first of all connected to the terminal contacts 4, 5 on the substrate 3 by means of laser welding, for example. Only then is the power semiconductor 1 placed on the substrate 3 and contacted by means of soldering and bonding wires 7, 8. This has the advantage that the power semiconductor 1 cannot be impaired by laser welding the parts 12, 14, and the movement space for laser welding is not restricted.

Figure 3:
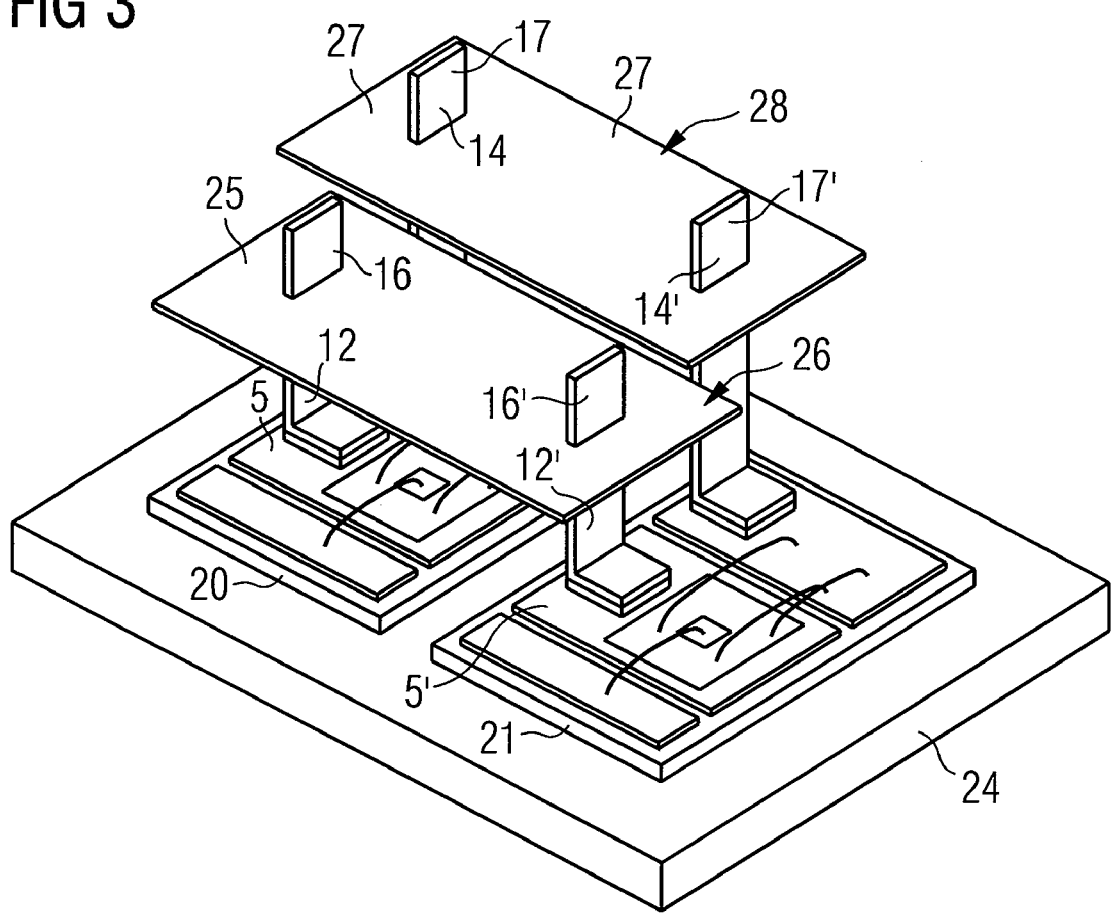
FIG. 3 shows the mounting of a plurality of circuit units so as to form a power module according to the invention.

FIG. 3 shows two circuit units 20, 21 which have been premounted as shown in FIG. 1 or 2. Said circuit units are arranged on a common base plate 24. The free end regions 16, 16' of the respective first parts 12, 12' are connected to a second part 25, for example by means of pressing-in, compression, squeezing, bonding, crimping, riveting, soldering, particularly inductive hard soldering, welding, particularly cold welding, ultrasonic welding, laser welding, inductive welding or resistance welding, so as to form a current-carrying strap 26. The free end regions 17, 17' of the respective first parts 14, 14' are equally connected to a second part 27 so as to form a current-carrying strap 28.

After being mounted separately, the parts 12, 12' and 14, 14' and 25, 27 thus complement one another to form a respective current-carrying strap 26, 28 which connects the corresponding terminal contacts (for example 5 and 5') of the circuit units 20 and 21 in parallel. The second parts 25 and 27 are arranged at a distance from one another in a parallel or else plane-parallel manner. The module formed in this manner may be introduced and, if appropriate, potted into a housing in a known manner.

When mounting the circuit units 20, 21 on the common base plate 24, a mounting template may first of all be used for precise positioning, said template having openings precisely where the end regions 16, 16'; 17, 17' of the first parts are intended to be arranged later and are intended to penetrate the second part. The circuit units are thus aligned according to the template.

Mounting of the module according to the invention is thus considerably simplified. The ability to test the connection between the first parts 12, 14 and the assigned terminal contacts at an early stage improves quality assurance. The configuration of the current-carrying strap enables the module to have a very compact and space-saving design.

According to one preferred embodiment of the invention, a power module according to the invention is in the form of a half-bridge module. Such a half-bridge module preferably comprises a plurality of half-bridges which are each arranged on a substrate. Each half-bridge forms a circuit unit.

Figure 4:
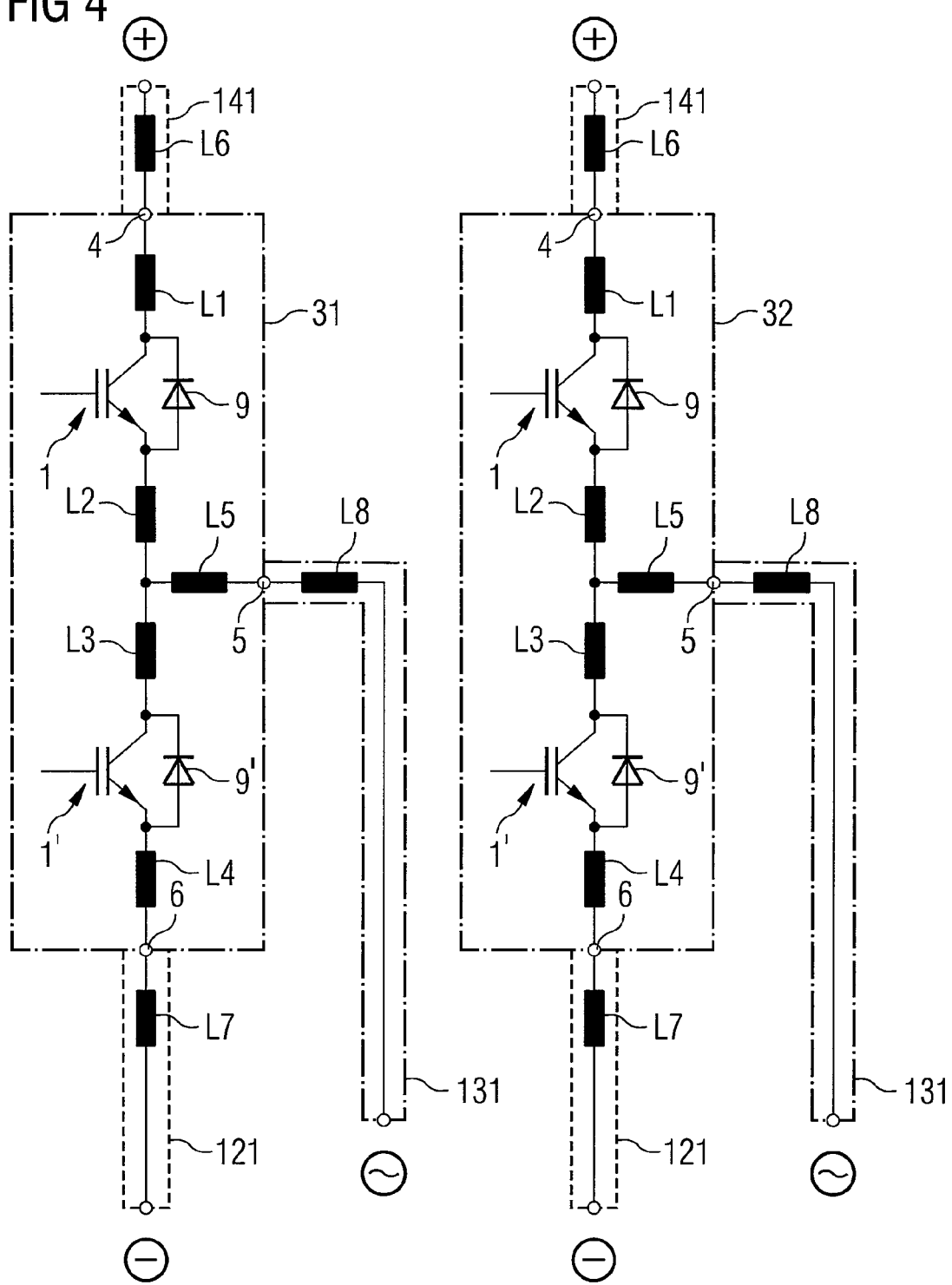
FIG. 4 shows a circuit diagram having two half-bridges which are of identical design and are provided for the purpose of parallel connection in a power module according to the invention.

FIG. 4 shows a circuit diagram having two circuit units 31, 32 of this type. Each of the circuit units 31, 32 comprises two power semiconductors 1, 1' whose load paths are connected in series. The power semiconductors 1, 1' may be in the form of, for example, transistors, thyristors, triacs, FETS, MOSFETs or IGBTs. A freewheeling diode 9, 9' is also reverse-connected in parallel with each load path of a power semiconductor 1, 1'.

Each of the circuit units 31, 32 is implemented on a substrate. The power semiconductors 1, 1' and the freewheeling diodes 9, 9' of a circuit unit 31, 32 are connected to one another and to terminal contacts in the plane of the respective substrate by means of conductor tracks. Each of these conductor tracks has an inductance. FIG. 4 illustrates equivalent inductances L1 to L5 corresponding to the inductances of the conductor tracks.

In order to increase the switching capacity of a power module according to the invention, two or more circuit units 31, 32 may be connected in parallel. To this end, mutually corresponding terminal contacts 4, 5, 6 of the circuit units 31, 32 are electrically conductively connected to one another. In the case of the terminal contacts 6 and 4 for the negative and positive supply voltages and the terminal contacts 5 for the phase output, use is preferably made, for this purpose, of a respective multipart current-carrying strap corresponding to the current-carrying straps 26, 28 shown in FIG. 3.

To this end, each of the circuit units 31, 32 has first parts 121, 131, 141 which are connected to the terminal contacts for the negative supply voltage, the phase output and the positive supply voltage. The first parts 121, 131, 141 are preferably formed in accordance with the first parts 12, 12', 14, 14' shown in FIGS. 1 to 3.

Each of the first parts 121, 131, 141 has an inductance which is presented in FIG. 4 using equivalent inductances L6, L8, L7. The inductances L6, L8, L7 of the first parts 121, 131, 141 are preferably between 5 nH and 100 nH, particularly preferably approximately 20 nH, while, in comparison to this, the inductances L1 to L5 are considerably lower, preferably respectively less than 5 nH.

Figure 5:
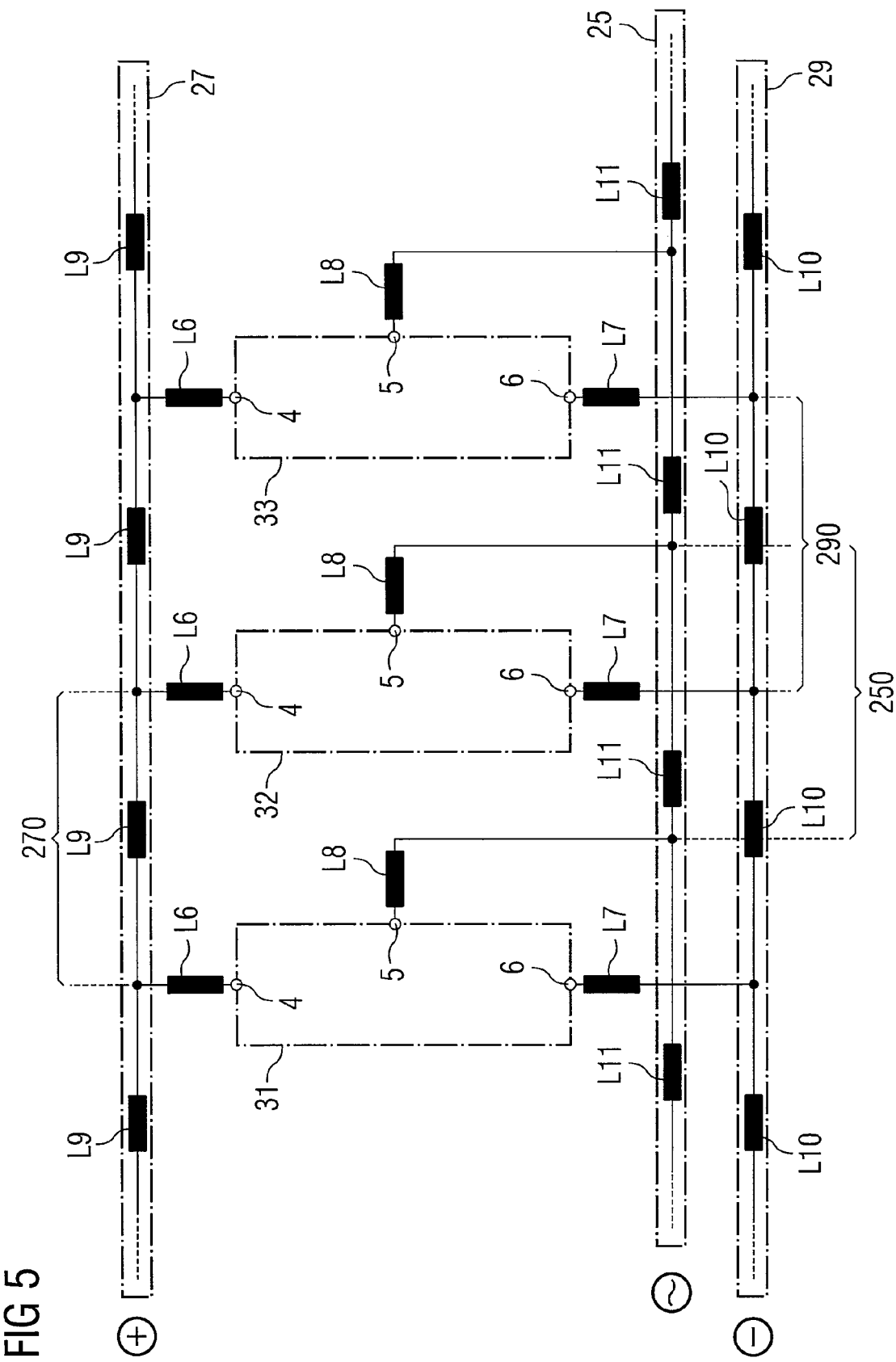
FIG. 5 shows a circuit diagram of a half-bridge module having three half-bridges which are of identical design and are electrically connected in parallel with one another.

FIG. 5 shows a number of circuit units 31, 32, 33 which preferably have a structure in accordance with the circuit units 31, 32 shown in FIG. 4 and are of identical design. The mutually corresponding first parts of the circuit units 31, 32, 33 are electrically conductively connected using second parts 29, 27, 25. The mutually corresponding first parts of the circuit units 31, 32, 33 respectively form a current-carrying strap together with the second part 29, 27 or 25 that connects them.

In this case, the associated second parts 29, 27 and 25 which connect the first parts of two adjacent circuit units 31, 32, 33 have sections 290, 270, 250 having inductances which are illustrated in FIG. 5 in the form of equivalent inductances L9, L10 and L11. The value of these equivalent inductances L9, L10, L11 is preferably less than 10 nH, particularly preferably less than 5 nH.

Figure 6A:
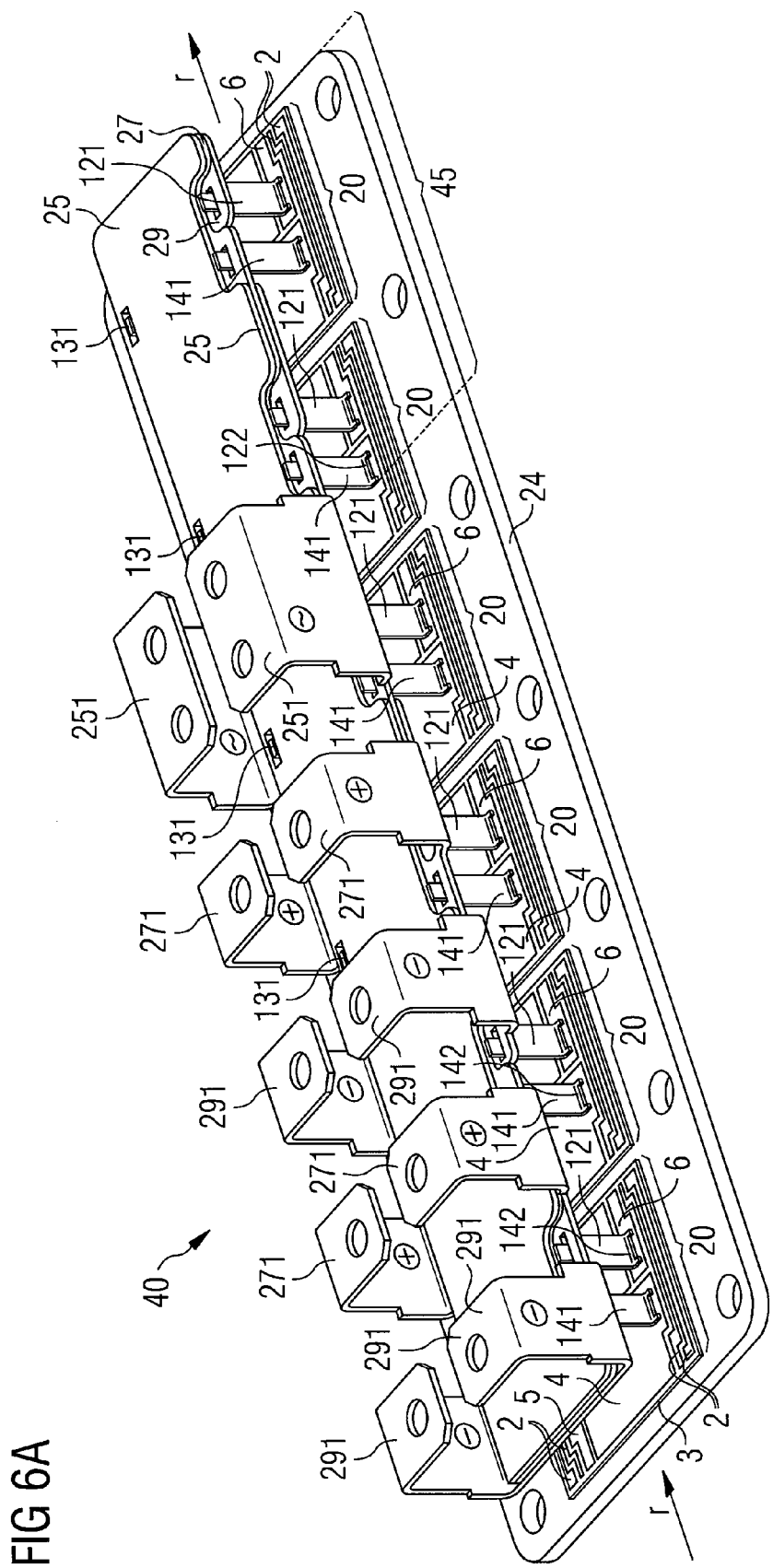
FIGS. 6a-b show a perspective view of a power module which is in the form of a half-bridge module and has a plurality of circuit units which are electrically connected in parallel using current-carrying straps, with the housing removed.

FIG. 6a shows a perspective view of a power module 40 having six circuit units 20 which each have a half-bridge and comprise a substrate as well as power elements and conductor tracks 2. The circuit units 20 are arranged on a base plate 24 and are electrically connected in parallel using current-carrying straps 25, 27, 29 according to the invention. The circuit units 20 are preferably of identical design and are arranged in succession, in a connecting direction r, at an equal distance from one another. The substrates 3 may advantageously be arranged according to the designs in German patent application DE 10 2004 042 367.

According to one preferred embodiment of the invention, each of the circuit units 20 comprises a half-bridge corresponding to the half-bridges 31, 32, 33 shown in FIGS. 4 and 5.

Each of the circuit units 20 has first parts 121 for connecting the negative supply voltage, 141 for connecting the positive supply voltage and 131 for the phase output. The first parts 131, 141 and 121 which are connected to one another using a second part 25, 27, 29 are preferably arranged behind one another in a row in the connecting direction r. According to one particularly preferred embodiment of the invention, the first parts 121, 141 are arranged in a row and are arranged in succession with alternating polarity in the connecting direction r in order to supply the negative and positive supply voltages.

The second parts 25, 27, 29 are preferably essentially flat and are arranged parallel to the plane of the circuit units 25 and the base plate 24.

The second parts 25, 27, 29 optionally have connection lugs 251, 271 and 291 which are preferably integrally formed with the respective second parts 25, 27, 29. The connection lugs 251, 271, 291 may thus be punched in a simple manner from flat sheet metal using a punching tool and bent into the desired shape. The connection lugs 251, 271, 291 are preferably arranged on that side of the relevant second part 25, 29, 27 which faces away from the base plate 24. According to one preferred embodiment, two connection lugs 251, 271, 291 having the same electrical potential are respectively arranged in pairs and opposite one another in a direction transverse to the connecting direction r. In this case, it is advantageous if the connection lugs 271, 291 are alternately arranged in succession with different polarity +/− in the connecting direction r.

Figure 6B:
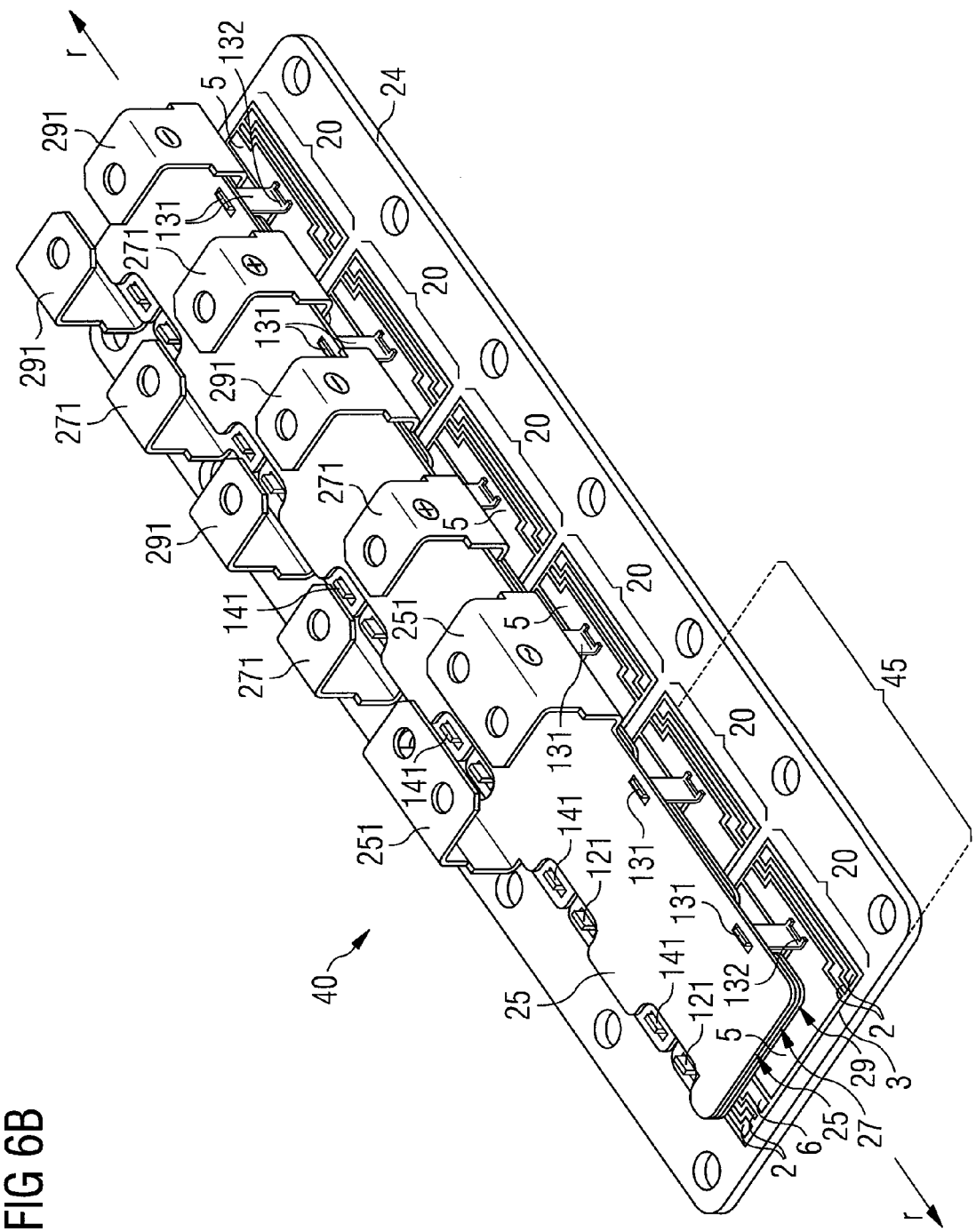

The first parts have feet 122, 142 and feet 132 (see FIG. 6b) which are connected to corresponding terminal contacts 6, 4 and 5 (see FIG. 6b). The feet can advantageously be arranged one below the other according to the designs in DE 10 2004 027 185.

In order to achieve a higher current-carrying capacity, the connection lugs 251 for connecting the phase output are preferably designed for a higher current-carrying capacity than the connection lugs 271, 291 for the positive and negative supply voltages. This may be achieved, in particular, by selecting the dimensions of the connection lugs 251 for the phase output to be larger, in the connecting direction r, than the dimensions of the connection lugs 271, 291 for connecting the positive and negative supply voltages.

According to another preferred embodiment of the invention, the half-bridge module has, in the connecting direction r, a section 45 in which none of the second parts 25, 27, 29 are provided with connection lugs 251, 271 and 291. This creates a region above the second parts 25, 27, 29, said region being free of electrical main connections and being able to be used, for example, to hold drive circuits or sensors.

FIG. 6b shows a view corresponding to FIG. 6a but with a power module 40 that has been rotated through 180°. The first parts 131 which are connected to terminal contacts 5 for connecting the phase outputs can be seen in this view. The first parts 131 are arranged opposite the first parts 121, 141 in a direction transverse to the connecting direction r.

Figure 7:
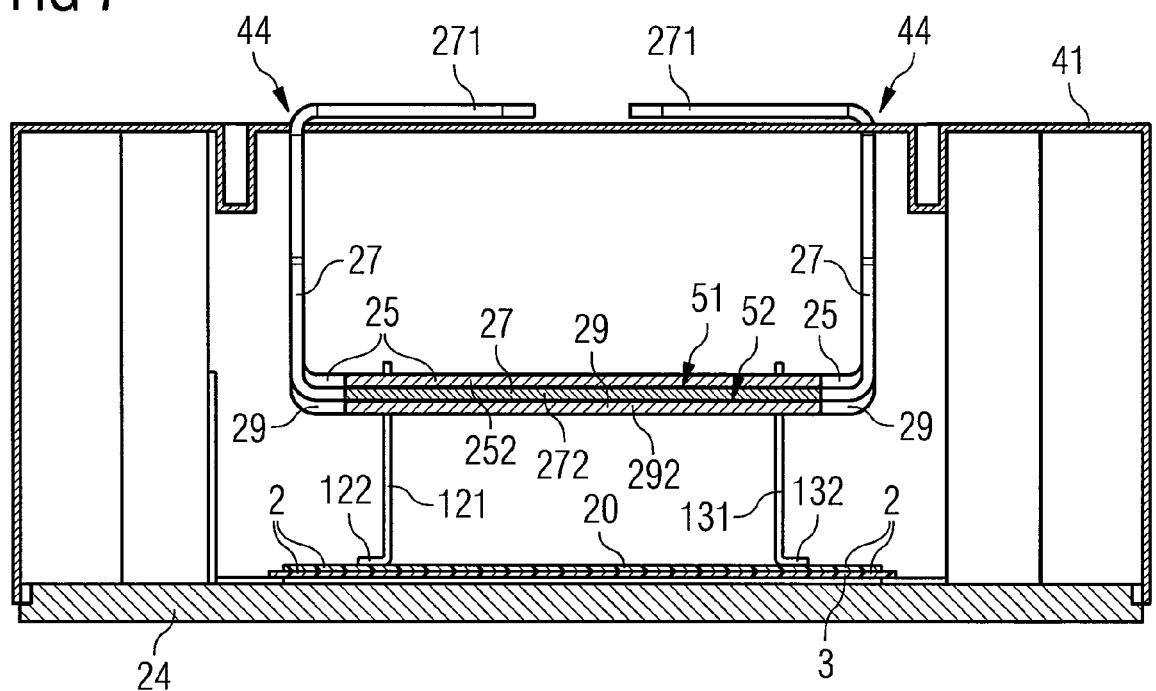
FIG. 7 shows a side view of a cross section through the half-bridge module shown in FIG. 6.

FIG. 7 illustrates a side view of a cross section through a power module 40 which corresponds to the power module 40 shown in FIGS. 6a and 6b but also has a housing. The cross section runs transverse to the connecting direction r between a connection strap 271 and a connection strap 291 which is adjacent to the latter, with a view of the connection strap 271 counter to the connecting direction r.

The housing 40 comprises a housing body 41 and the base plate 24. Connected to the base plate 24 is a substrate which comprises a circuit unit 20. In addition to the power semiconductors which are not illustrated in any more detail, the circuit unit 20 has conductor tracks 2.

A first part 121 connects the circuit unit 20 to a second part 27. A further first part 131 correspondingly connects the circuit unit 20 to a second part 25.

Overall, the arrangement comprises three second parts 25, 27, 29 which are routed parallel to one another and are electrically insulated from one another using insulating films 51, 52. As shown in FIGS. 6a and 6b, the second parts 25, 27, 29 have connection lugs 251, 271, 291, of which only connection lugs 271 can be seen in FIG. 7. The connection lugs 271 as well as the connection lugs 251, 291 which cannot be seen are routed out of the housing body 41 through openings 44. When mounting the power module, the connection lugs may first of all be inserted through the openings 44 and then bent around into their final position.

Each of the second parts 25, 27, 29 has a continuous, preferably lower section 252, 272, 292 which is at a distance from the circuit units 20 which are to be connected to one another. The continuous sections 252, 272, 292 are provided to connect mutually corresponding first parts of the circuit units 20, which are to be electrically connected in parallel with one another, and preferably extend in the connecting direction r from the first to the last of the circuit units 20. In this case, the continuous sections 252, 272, 292 preferably run in a plane-parallel manner to one another and in a plane-parallel manner to the plane of the base plate 24. The continuous sections 252, 272, 292 of the second parts 25, 27, 29 are also arranged inside the housing, particularly preferably inside the housing body 41.

The housing may be optionally potted using a potting compound which preferably extends from the base plate 24 to beyond the continuous section 252 the second part 25 which is furthest away from the base plate 24. The continuous sections 252, 272, 292 are thus surrounded by the potting compound. In this case, the connection lugs of the second parts project from the potting compound.

LIST OF REFERENCE SYMBOLS a), b), c) Mounting step
a'), b'), c') Mounting step
1, 1' Power semiconductor
2 Conductor track
3 Substrate
4, 5, 5', 6 Terminal contact
7, 8 Bonding wires
9, 9' Freewheeling diode
10, 11 Foot
12, 12' First part
14, 14' First part
16, 16' End region
17, 17' End region
18 Plane
20, 21 Circuit units
24 Base plate
25 Second part (phase output)
26 Current-carrying strap
27 Second part (positive supply voltage)
28 Current-carrying strap
29 Second part (negative supply voltage)
31, 32, 33 Circuit unit
40 Power module
41 Housing body
44 Opening
45 Section of the power module
51, 52 Insulating film
121 First part (negative supply voltage)
122 Foot
131 First part (phase output)
122 Foot
141 First part (positive supply voltage)
142 Foot
250 Section of the second part
251 Connection lug (phase output)
252 Continuous section
270 Section of the second part
271 Connection lug (positive supply voltage)
272 Continuous section
290 Section of the second part
291 Connection lug (negative supply voltage)
292 Continuous section
L1 . . . L11 Equivalent inductance
r Connecting direction

What is claimed is:

1. A power module comprising a plurality of circuit units, each of the circuit units comprising a half bridge with two power semiconductor components connected in series, and wherein the half bridges are connected in parallel, and
   a current-carrying strap, each circuit unit having a substrate with a terminal contact with which contact is to be made and which is electrically connected in a parallel manner to the corresponding terminal contact of another circuit unit via the current-carrying strap,
   wherein the current-carrying strap has a plurality of separate connection elements and a connecting element,
   the connection elements of two adjacent circuit units are connected by a section of the connecting element, said section having an inductance of less than 10 nH,
   each connection element has an inductance between 5 nH and 100 nH and is assigned to the terminal contact of only a single one of the circuit units,
   in a connecting direction, each connection element can be permanently connected to the terminal contact assigned to it independently of the connecting element and the further connection elements of the power module, and the connecting element connects the circuit units in parallel by means of a connection to the separate connection elements,
   each power semiconductor component is electrically connected with a conductor track of the corresponding substrate having an inductance of less than 5 nH,
   the connection element comprises a connection lug for externally connecting the module, the connection lug being arranged above one of the circuit units,
   a section of the connection element, which section is arranged above one of the circuit units, is not equipped with a connection lug.

2. A power module according to claim 1, wherein at least one of the connection elements is L-shaped.

3. A power module according to claim 1, wherein at least one of the connection elements has a foot region which is connected to the terminal contact of the circuit unit.

4. A power module according to claim 1, wherein at least one of the connection elements is connected to a terminal contact of a circuit unit by means of bonding, soldering or laser welding.

5. A power module according to claim 1, wherein the connecting element has a continuous section which electrically connects the separate connection elements to one another.

6. A power module according to claim 5, further comprising a housing, the continuous section of the connecting element being arranged inside the housing.

7. A power module according to claim 5, wherein the continuous section is arranged on that side of the connecting element which faces the common carrier.

* * * * *

UNITED STATES PATENT AND TRADEMARK OFFICE
CERTIFICATE OF CORRECTION

PATENT NO. : 7,656,672 B2　　　　　　　　　　　　　　　　Page 1 of 1
APPLICATION NO. : 11/381881
DATED : February 2, 2010
INVENTOR(S) : Schilling et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 353 days.

Signed and Sealed this

Thirtieth Day of November, 2010

David J. Kappos
*Director of the United States Patent and Trademark Office*